(12) United States Patent
Hamada et al.

(10) Patent No.: US 7,368,774 B2
(45) Date of Patent: May 6, 2008

(54) CAPACITOR AND ITS MANUFACTURING METHOD, FERROELECTRIC MEMORY DEVICE, ACTUATOR, AND LIQUID JETTING HEAD

(75) Inventors: Yasuaki Hamada, Suwa (JP); Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 59 days.

(21) Appl. No.: 11/531,424

(22) Filed: Sep. 13, 2006

(65) Prior Publication Data

US 2007/0075355 A1   Apr. 5, 2007

(30) Foreign Application Priority Data

Oct. 5, 2005   (JP)   ............................. 2005-292552

(51) Int. Cl.
  *H01L 27/108*   (2006.01)
  *H01L 29/76*   (2006.01)
  *H01L 21/8242*   (2006.01)

(52) U.S. Cl. ...................... 257/295; 257/296; 257/306; 257/E21.272; 257/E27.084; 257/E27.104; 438/239; 438/396

(58) Field of Classification Search ................ 257/295, 257/296, 306, E27.084, E27.104, E29.343, 257/E21.272; 438/3, 239, 396
See application file for complete search history.

(56) References Cited

U.S. PATENT DOCUMENTS

| | | | | |
|---|---|---|---|---|
| 6,232,133 | B1 * | 5/2001 | Kim et al. | 438/3 |
| 6,605,477 | B2 * | 8/2003 | Uchiyama | 438/3 |
| 6,855,973 | B2 * | 2/2005 | Otabe et al. | 257/295 |
| 7,037,731 | B2 * | 5/2006 | Kijima et al. | 438/3 |
| 2005/0151177 | A1 * | 7/2005 | Miyazawa et al. | 257/295 |

FOREIGN PATENT DOCUMENTS

JP    10-223847    8/1998

* cited by examiner

*Primary Examiner*—T. N. Quach
(74) *Attorney, Agent, or Firm*—Harness, Dickey & Pierce, P.L.C.

(57) ABSTRACT

A capacitor includes a lower electrode, a first dielectric film composed of lead zirconate titanate niobate formed above the lower electrode, a second dielectric film composed of lead zirconate titanate or lead zirconate titanate niobate with a Nb composition smaller than a Nb composition of the lead zirconate titanate niobate composing the first dielectric film, and an upper electrode formed above the second dielectric film.

5 Claims, 8 Drawing Sheets

CAPACITOR AND ITS MANUFACTURING METHOD, FERROELECTRIC MEMORY DEVICE, ACTUATOR, AND LIQUID JETTING HEAD

The entire disclosure of Japanese Patent Application No. 2005-292552, filed Oct. 5, 2005 is expressly incorporated by reference herein.

BACKGROUND

1. Technical Field

The present invention relates to capacitors, methods for manufacturing the same, ferroelectric memory devices, actuators, and liquid jetting heads.

2. Related Art

Ferroelectric memories are characterized by nonvolatlity, high-speed writing/reading operations, and low power consumption, and are one of the most powerful candidates as next-generation nonvolatile memories.

One of commonly known structures of ferroelectric memories is a 1T1C type structure. Ferroelectric memories with 1T1C type structure were initially developed in the form of a planar type structure. However, as higher integration of ferroelectric memories advanced, structures with smaller cell areas have been demanded, which has led to the development of ferroelectric memories in a stacked type structure. An example of related art is described in Japanese laid-open patent applications JP-A-10-223847.

SUMMARY

In accordance with an advantage of some aspects of the present invention, it is possible to provide capacitors having a ferroelectric film that can have good crystallinity and good hysteresis characteristics, and a method for manufacturing such capacitors. Also, in accordance with another advantage of some aspects of the present invention, there can be provided ferroelectric memory devices, actuators and liquid jet heads.

A capacitor in accordance with an embodiment of the invention includes a lower electrode, a first dielectric film composed of lead zirconate titanate niobate formed above the lower electrode, a second dielectric film composed of lead zirconate titanate or lead zirconate titanate niobate with a smaller Nb composition than that of the lead zirconate titanate niobate composing the first dielectric film, and an upper electrode formed above the second dielectric film.

The capacitor includes the first dielectric film and the second dielectric film. As a result, the dielectric film (i.e., the first dielectric film and the second dielectric film) can be oriented to a higher degree, and its remanent polarization can be made greater. In other words, the capacitor has the ferroelectric films with excellent crystallinity, and can therefore have excellent hysteresis characteristics. This is confirmed by experimental examples to be described below.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an aforementioned exemplary case, assuming that the use of the term includes a case of "B" formed directly on "A," and a case of "B" formed over "A" through another member on "A."

The capacitor in accordance with an aspect of the embodiment of the invention may include a third dielectric film composed of lead zirconate titanate niobate formed above the second dielectric film, wherein, when the second dielectric film is composed of lead zirconate titanate niobate, the lead zirconate titanate niobate composing the third dielectric film may have a Nb composition that is greater than that of the lead zirconate titanate niobate composing the second dielectric film.

A method for manufacturing a capacitor in accordance with another embodiment of the invention includes the steps of forming a lower electrode above a substrate, forming a first dielectric film composed of lead zirconate titanate niobate above the lower electrode, forming above the first dielectric film a second dielectric film composed of lead zirconate titanate or lead zirconate titanate niobate with a smaller Nb composition than that of the lead zirconate titanate niobate composing the first dielectric film, applying a heat treatment to at least the second dielectric film, forming a third dielectric film composed of lead zirconate titanate niobate above the second dielectric film, and forming an upper electrode above the third dielectric film, wherein, when the second dielectric film is composed of lead zirconate titanate niobate, the lead zirconate titanate niobate composing the third dielectric film has a Nb composition that is greater than that of the lead zirconate titanate niobate composing the second dielectric film, and the heat treatment is conducted before the step of forming the third dielectric film.

A ferroelectric memory device in accordance with an embodiment of the invention includes a lower electrode, a first dielectric film composed of lead zirconate titanate niobate formed above the lower electrode, a second dielectric film composed of lead zirconate titanate or lead zirconate titanate niobate with a smaller Nb composition than that of the lead zirconate titanate niobate composing the first dielectric film, an upper electrode formed above the second dielectric film, and a control circuit section that is electrically connected to at least one of the lower electrode and the upper electrode.

The ferroelectric memory device in accordance with an aspect of the embodiment of the invention includes a substrate, an interlayer dielectric film formed above the substrate, and a plug layer embedded in a contact hole formed in the interlayer dielectric film, wherein the lower electrode may be formed in contact with at least an upper surface of the plug layer.

An actuator in accordance with an embodiment of the invention includes an elastic plate, a lower electrode formed above the elastic plate, a first dielectric film composed of lead zirconate titanate niobate formed above the lower electrode, a second dielectric film composed of lead zirconate titanate or lead zirconate titanate niobate with a smaller Nb composition than that of the lead zirconate titanate niobate composing the first dielectric film, and an upper electrode formed above the second dielectric film.

A liquid jet head in accordance with an embodiment of the invention includes a substrate, an elastic plate formed above the substrate, a lower electrode formed above the elastic plate, a first dielectric film composed of lead zirconate titanate niobate formed above the lower electrode, a second dielectric film composed of lead zirconate titanate or lead zirconate titanate niobate with a smaller Nb composition than that of the lead zirconate titanate niobate composing the first dielectric film, an upper electrode formed above the second dielectric film, a flow channel formed in the substrate, and a nozzle plate formed below the substrate and having nozzle holes connecting to the flow channel.

It is noted that, in descriptions concerning the invention, the term "below" may be used, for example, in a manner as "B formed 'below' A." In descriptions concerning the invention, the term "below" is used, in such an aforementioned exemplary case, assuming that the use of the term includes a case of "B" formed directly on "A," and a case of "B" formed over "A" through another member on "A."

BRIEF DESCRIPTION OF THE DRAWINGS

FIG. 4 shows a result of X-ray diffraction measurement conducted on a capacitor that is formed according to Experimental Example Condition a.

FIG. 10 shows a result of hysteresis characteristic measurement conducted on a capacitor that is formed according to Condition a.

DESCRIPTION OF EXEMPLARY EMBODIMENTS

Preferred embodiments of the invention are described below with reference to the accompanying drawings.

Figure 1:
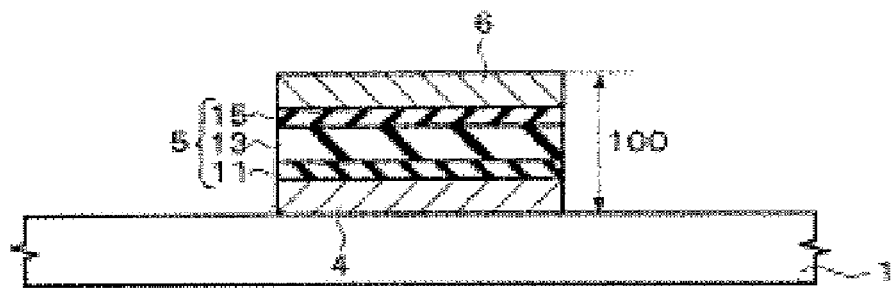
FIG. 1 schematically shows a cross-sectional view of a capacitor in accordance with a first embodiment of the invention.

1. First Embodiment 1.1. First, a method for manufacturing a capacitor in accordance with a first embodiment and a capacitor 100 that is obtained by the manufacturing method are described. FIG. 1 schematically shows a cross-sectional view of the capacitor 100 in accordance with the present embodiment.

(A) First, a lower electrode 4 is formed on a substrate 1. As the substrate 1, for example, a semiconductor substrate, a resin substrate or the like can be optionally used according to the usage without any particular limitation. As the lower electrode 4, for example, a high melting metal such as Pt, Ir or the like, or its oxide can be used. The lower electrode 4 may be in a single layer film structure or a multilayer film structure, and may include a functional film such as an oxygen diffusion prevention film or the like. The lower electrode 4 may be formed by, for example, a sputter method, a vapor deposition method or the like. The lower electrode 4 may have a structure, for example, of Pt (100 nm)/IrOx (30 nm)/Ir (100 nm)/TiAlN (100 nm).

(B) Next, a first dielectric film 11 is formed on the lower electrode 4. The first dielectric film 11 is composed of lead zirconate titanate niobate (Pb (Zr, Ti, Nb) $O_3$) (hereafter also referred to as "PZTN"). PZTN is a dielectric substance in which Nb is added in lead zirconate titanate (Pb (Zr, Ti) $O_3$) (hereafter also referred to as "PZT"). The first dielectric film 11 may be formed by, for example, a spin coat method in which a sol-gel solution containing Pb, Zr, Ti and Nb is coated on the lower electrode 4. The first dielectric film 11 may have a film thickness of, for example, 5 nm.

(C) Next, a heat treatment may preferably be conducted. By this heat treatment, the crystallinity of a dielectric film 5 including the first dielectric film 11 can be improved. This is confirmed by experimental examples to be described below. The heat treatment may be conducted by RTA. The heat treatment may be conducted, for example, in an oxygen atmosphere at 650° C. for 3 minutes.

(D) Next, a second dielectric film 13 is formed on the first dielectric film 11. The second dielectric film 13 may be composed of PZT, or PZTN with a Nb composition smaller than that of PZTN composing the first dielectric film 11. The second dielectric film 13 may be formed by using, for example, a spin coat method, in which a sol-gel solution containing constituent elements (Pb, Zr and Ti in the case of PZT, and Pb, Zr, Ti and Nb in the case of PZTN) is coated on the first dielectric film 11. The second dielectric film 13 may have a film thickness of, for example, 100 nm.

(E) Next, a heat treatment may preferably be conducted. By the heat treatment, the crystallinity of the dielectric film 5 including the second dielectric film 13 can be improved. In particular, when a third dielectric film 15 to be described below is to be formed on the second dielectric film 13, the heat treatment in this step is effective. This is confirmed by experimental examples to be described below. The heat treatment may be conducted by RTA. The heat treatment may be conducted, for example, in an oxygen atmosphere at 650° C. for 3 minutes.

(F) Next, a third dielectric film 15 composed of PZTN is formed on the second dielectric film 13, and a heat treatment may preferably be conducted. By this heat treatment, the crystallinity of the dielectric film 5 including the third dielectric film 15 can be improved. This is confirmed by experimental examples to be described below. When the second dielectric film 13 is composed of PZTN, PZTN composing the third dielectric film 15 may preferably have a Nb composition greater than that of the PZTN composing the second dielectric film 13. The third dielectric film 15 may be formed by using, for example, a spin coat method, in which a sol-gel solution containing Pb, Zr, Ti and Nb is coated on the second dielectric film 13. The third dielectric film 15 may have a film thickness of, for example, 5 nm. The heat treatment may be conducted by RTA. The heat treatment may be conducted, for example, in an oxygen atmosphere at 650° C. for 3 minutes. It is noted that, the present embodiment can be completed without forming the third dielectric film 15.

By the steps described above, the dielectric film 5 composed of the first—third dielectric films 11, 13 and 15 is formed on the lower electrode 4.

(G) Next, a heat treatment may be conducted. By this, the crystallinity of the dielectric film 5 can be improved. The heat treatment may be conducted by RTA. The heat treatment may be conducted, for example, at 650° C. for 5 minutes.

(H) Next, an upper electrode 6 is formed on the dielectric film 5. As the upper electrode 6, for example, a high melting point metal such as Pt, Ir or the like, or its oxide can be used. The upper electrode 6 may be formed by, for example, a sputter method, a vapor deposition method or the like. The upper electrode 6 may have a film thickness of, for example, 100 nm.

(I) Next, a heat treatment may be conducted. The heat treatment may be conducted by RTA. The heat treatment may be conducted, for example, at 650° C. for 10 minutes.

(J) Next, as shown in FIG. 1, the upper electrode 6, the dielectric film 5 and the lower electrode 4 are etched into a desired configuration. By this, a columnar deposited body composed of the lower electrode 4, the dielectric film 5 and the upper electrode 6 is formed on the substrate 1. The columnar deposited body defines a capacitor 100 in accordance with the present embodiment. In other words, by the steps described above, the capacitor 100 in accordance with the present embodiment can be formed, as shown in FIG. 1.

1.2. Next, an example in which the capacitor 100 in accordance with the present embodiment is applied to a ferroelectric memory device 200 is described.

Figure 2:
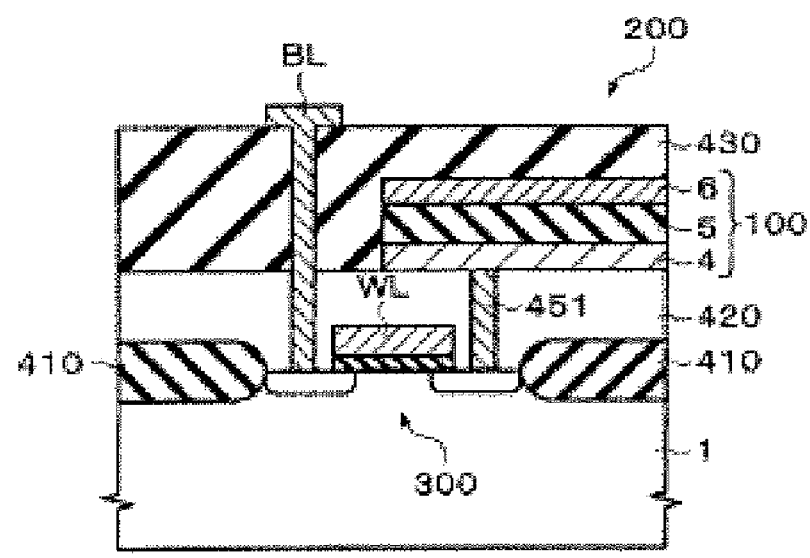
FIG. 2 schematically shows a cross-sectional view of a stacked type ferroelectric memory device in accordance with the first embodiment.

FIG. 2 is a cross-sectional view schematically showing the ferroelectric memory device 200 in accordance with the present embodiment. It is noted that the illustrated example is a stacked type ferroelectric memory device in a 1T1C type.

The ferroelectric memory device 200 includes a capacitor 100 and a control circuit section 300, as shown in FIG. 2.

The control circuit section 300 may include a variety of circuits for writing and reading data in and from the capacitor 100. The control circuit section 300 may be composed of MOS transistors formed near the surface of the substrate 1, as shown in FIG. 2. A gate electrode of the MOS transistor defines a word line WL. A bit line BL is electrically connected to the MOS transistor. The MOS transistor is isolated from other elements (not shown) by an element isolation region 410. A first interlayer dielectric film 420 is formed over the substrate 1 where the MOS transistor is formed. A capacitor 100 is formed on the first dielectric film 420. Further, a second interlayer dielectric film 430 is formed above the first interlayer dielectric film 420 in a manner to cover the capacitor 100. The control circuit section (i.e., the MOS transistor in the case of the illustrated example) 300 and the capacitor 100 are electrically connected to each other by a plug layer 451 embedded in a contact hole formed in the first interlayer dielectric film 420. The control circuit section 300 is electrically connected to at least one of the lower electrode 4 and the upper electrode 6. In the illustrated example, the control circuit section 300 is electrically connected to the lower electrode 4 through the plug layer 451. The lower electrode 4 is formed in contact with at least the upper surface of the plug layer 451. In the illustrated example, a portion of the lower surface of the lower electrode 4 is in contact with the upper surface of the plug layer 451.

Figure 3:
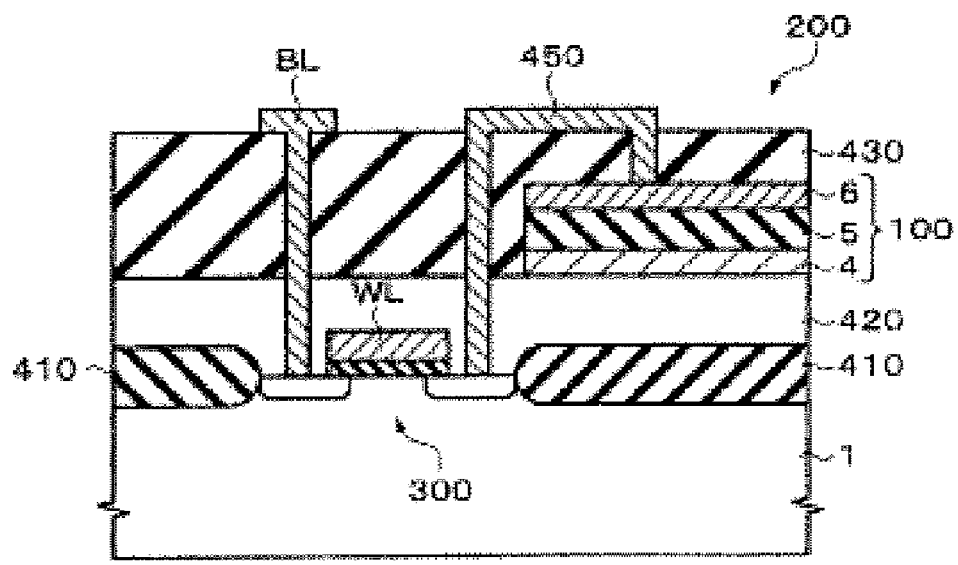
FIG. 3 schematically shows a cross-sectional view of a planar type ferroelectric memory device in accordance with the first embodiment.
Figure 4:
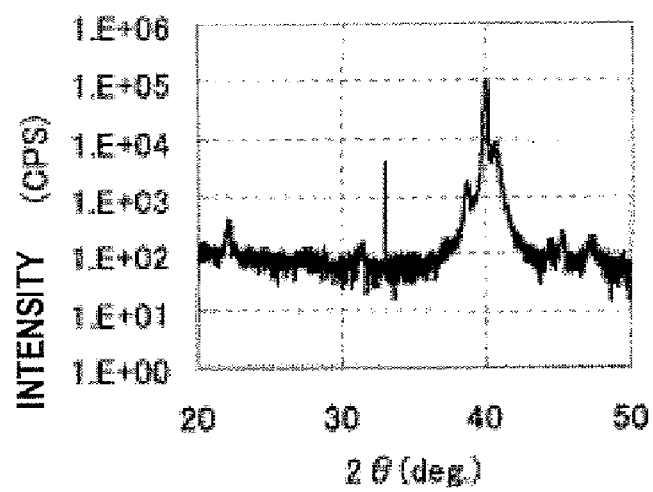
Figure 5:
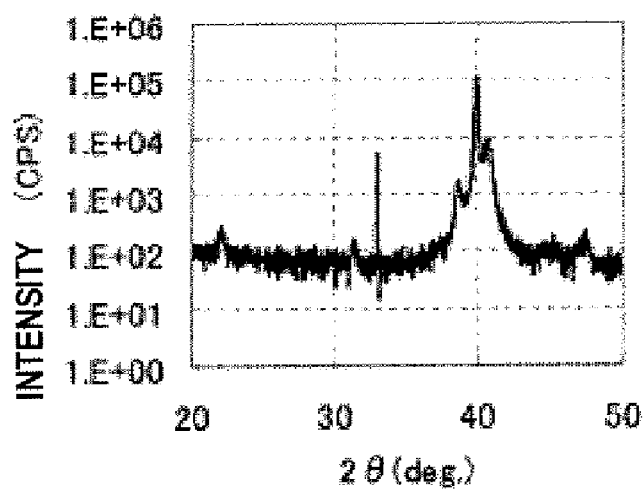
FIG. 5 shows a result of X-ray diffraction measurement conducted on a capacitor that is formed according to Experimental Example Condition b.
Figure 6:
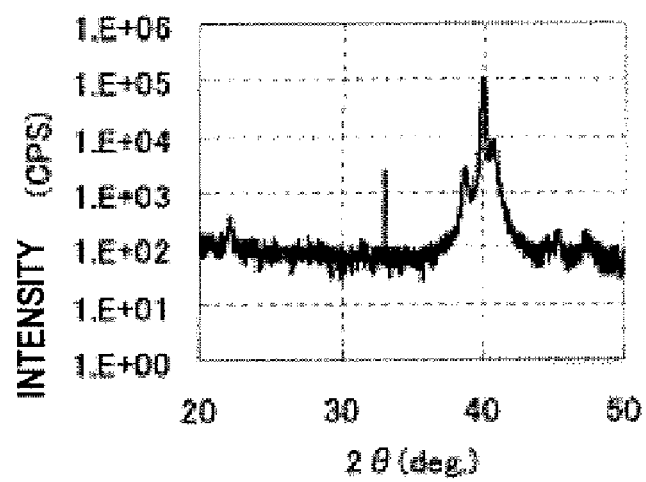
FIG. 6 shows a result of X-ray diffraction measurement conducted on a capacitor that is formed according to Experimental Example Condition c.
Figure 7:
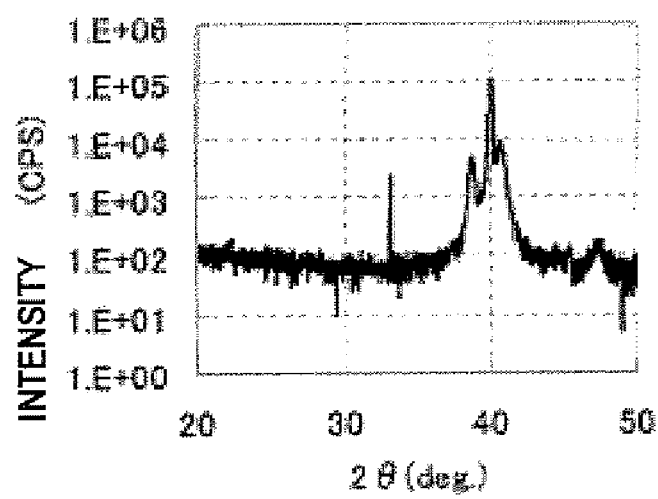
FIG. 7 shows a result of X-ray diffraction measurement conducted on a capacitor that is formed according to Experimental Example Condition d.

It is noted that the example shown in FIG. 2 is described with reference to a stacked type ferroelectric memory device in a 1T1C type. However, the capacitor 100 in accordance with the present embodiment may also be applicable to a planar type ferroelectric memory device in a 1T1C type, as shown in FIG. 3. FIG. 3 is a cross-sectional view schematically showing a planar type ferroelectric memory device 200 in accordance with the present embodiment. In the illustrated example, a circuit control section 300 is electrically connected to the upper electrode 6 through a wiring layer 450.

Also, in the example descried above, a 1T1C type ferroelectric memory device is described. However, the ferroelectric memory device in accordance with the present embodiment is also applicable to other ferroelectric memory devices using a variety of cell systems, such as, for example, 2T2C type, simple matrix type (cross-point type) and the like.

1.3. Next, experimental examples are described.

First, capacitors 100 were fabricated by using the manufacturing method described above. Conditions in fabricating the capacitors 100 are shown in Table 1 as Conditions a-d. Marks "O" indicate that steps listed in Table 1 were conducted, and marks "x" indicate that steps listed in Table 1 were not conducted. Other steps that are not listed in Table 1 were conducted in all of Conditions. As the first dielectric film 11 and the third dielectric film 15, $PbZr_{0.16}Ti_{0.60}Nb_{0.24}O_3$ was used. As the second dielectric film 13, $PbZr_{0.3}Ti_{0.7}O_3$ was used. As the lower electrode 4, a laminated film of a titanium aluminum nitride (TiAlN) layer, an iridium (Ir) layer, an iridium oxide (IrOx) layer and a platinum (Pt) layer laminated in this order was used.

Further, capacitors were fabricated without forming first dielectric films 11 or third dielectric films 15 as Comparison Examples. In other words, the dielectric film 5 was a PZT single layer. In Comparison Example 1, a heat treatment (the step (B) described above) was not conducted after the lower electrode 4 was formed, and in Comparison Example 2, the step (B) was conducted.

TABLE 1

|  | Condition a | Condition b | Condition c | Condition d | Comparison Example 1 | Comparison Example 2 |
|---|---|---|---|---|---|---|
| Step (B) Heat Treatment after formation of Lower Electrode | X | X | X | X | X | ○ |
| Step (C) Formation of 1st Dielectric Film | ○ | ○ | ○ | ○ | X | X |
| Step (D) Heat Treatment | X | ○ | X | ○ | X | X |
| Step (E) Formation of 2nd Dielectric Film | ○ | ○ | ○ | ○ | ○ | ○ |
| Step (F) Heat Treatment | ○ | ○ | X | ○ | ○ | ○ |
| Step (G) Formation of 3rd Dielectric Film + Heat Treatment | X | X | ○ | ○ | X | X |

Figure 8:
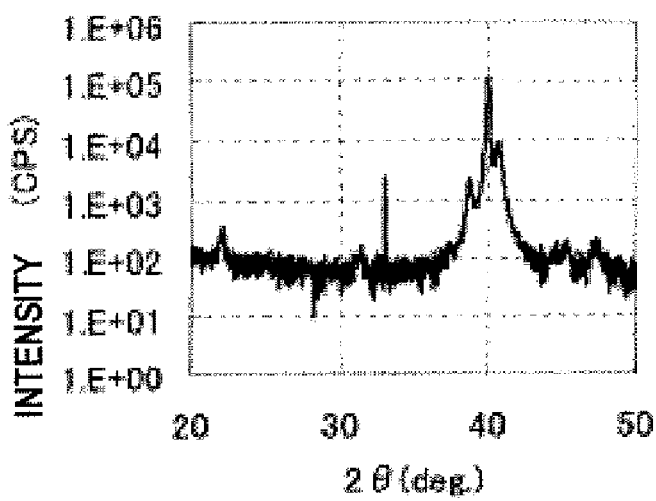
FIG. 8 shows a result of X-ray diffraction measurement conducted on a capacitor in accordance with a comparison example 1 of an experimental example.
Figure 9:
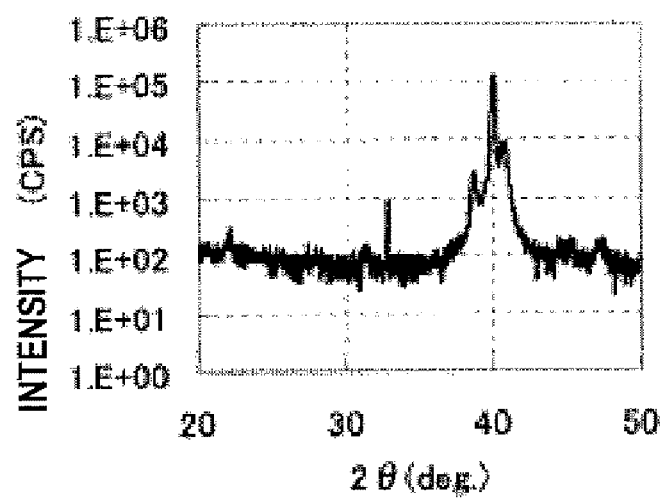
FIG. 9 shows a result of X-ray diffraction measurement conducted on a capacitor in accordance with a comparison example 1 of an experimental example.

FIGS. 4-7 show results of X-ray diffraction measurement conducted on the capacitors 100 when they were fabricated according to Conditions a through d. FIG. 8 and FIG. 9 show results of X-ray diffraction measurement conducted on Comparison Examples 1 and 2. Table 2 summarizes the results of X-ray diffraction measurements. Table 2 shows peak intensities at (100), (110) and (111) in the ferroelectric films 5, and peak intensity ratios at (111) in the sums of these peak intensities, respectively. It is noted that, for example, the peak intensity at (111) of the ferroelectric film 5 indicates the sum of a peak intensity of PZTN (111) and a peak intensity of PZT (111) under Conditions a through d, and indicates a peak intensity of PZT (111) in Comparison Examples.

treatment was conducted before formation of the third dielectric film 15 (Condition d), the peak intensity ratio at (111) of the dielectric film 5 was 98%. Under Condition d, the peak intensity ratio at (111) of the dielectric film 5 was the highest among all of the conditions. In other words, it is confirmed that, by forming the first—third dielectric films 11, 13 and 15 on the lower electrode 4, and conducting the heat treatment before forming the third dielectric film 15, the dielectric film 5 (the first—third dielectric films 11, 13 and 15) can be oriented in (111) to a higher degree.

Figure 10:
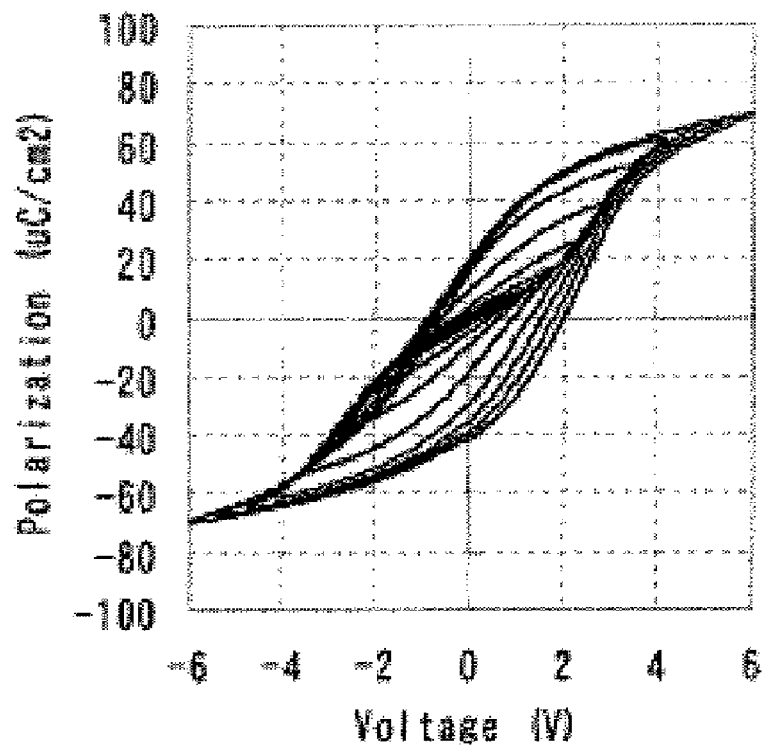
Figure 11:
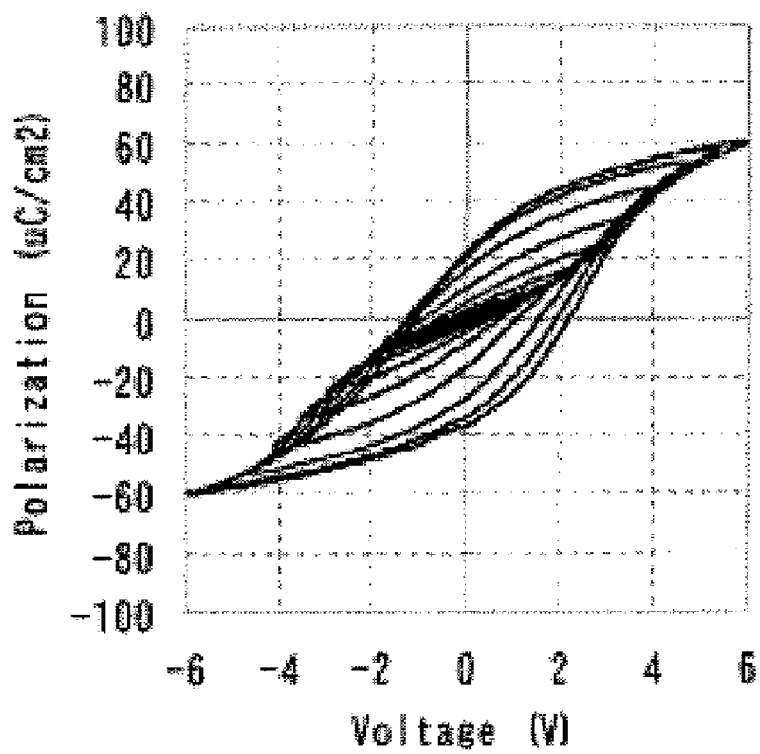
FIG. 11 shows a result of hysteresis characteristic measurement conducted on a capacitor that is formed according to Condition b.
Figure 12:
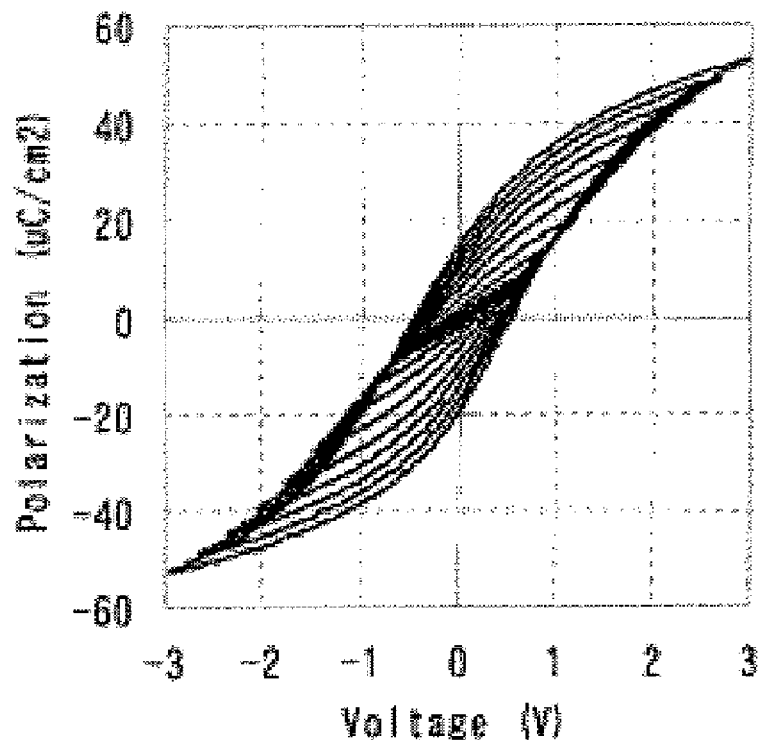
FIG. 12 shows a result of hysteresis characteristic measurement conducted on a capacitor that is formed according to Condition d.

Next, hysteresis characteristics of the capacitors 100 were measured. FIG. 10, FIG. 11 and FIG. 12 show results of hysteresis characteristic measurement conducted on the capacitors 100 when the capacitors 100 were fabricated

TABLE 2

|  | Condition a | Condition b | Condition c | Condition d | Comparison Example 1 | Comparison Example 2 |
|---|---|---|---|---|---|---|
| (100) Peak Intensity | 145 | 115 | 255 | 85 | 240 | 215 |
| (110) Peak Intensity | 30 | 55 | 30 | 20 | 40 | 40 |
| (111) Peak Intensity | 3015 | 4605 | 2325 | 4615 | 1805 | 2365 |
| (111) Peak Intensity Ratio | 95% | 96% | 89% | 98% | 87% | 90% |

As shown in Table 2, by comparing the peak intensity ratios of PZT (111), it becomes clear that the ferroelectric films 5 are oriented in (111) to a higher degree in the case of Condition a (95%) and Condition b (96%), compared with Comparison Example 1 (87%) and Comparison Example 2 (90%). This indicates that, by forming the second dielectric film 13 after forming the first dielectric film 11 on the lower electrode 4, the dielectric film 5 (the first and second dielectric films 11 and 13) is oriented in (111) to a higher degree.

Figure 13:
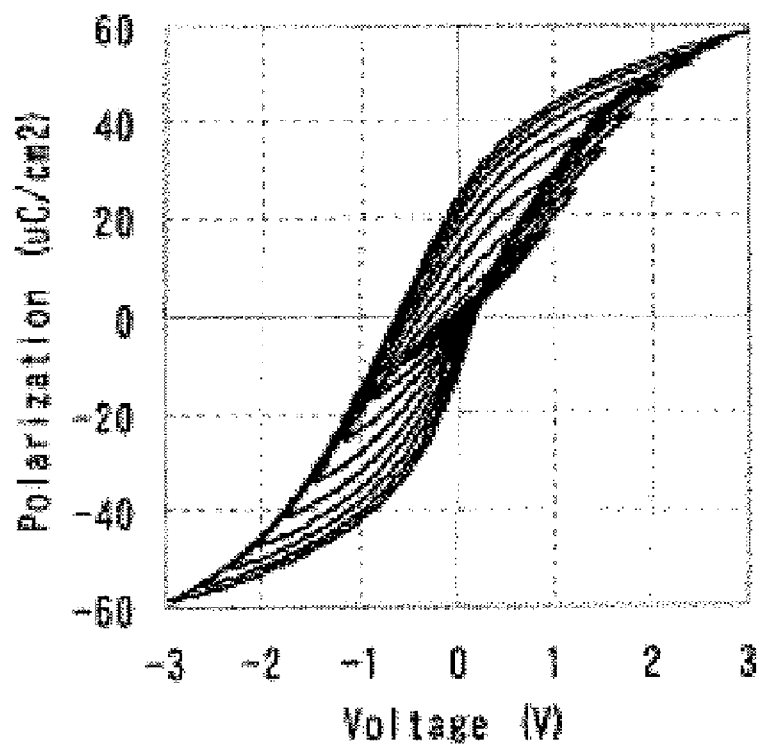
FIG. 13 shows a result of hysteresis characteristic measurement conducted on a capacitor in accordance with a comparison example 1 of an experimental example.
Figure 14:
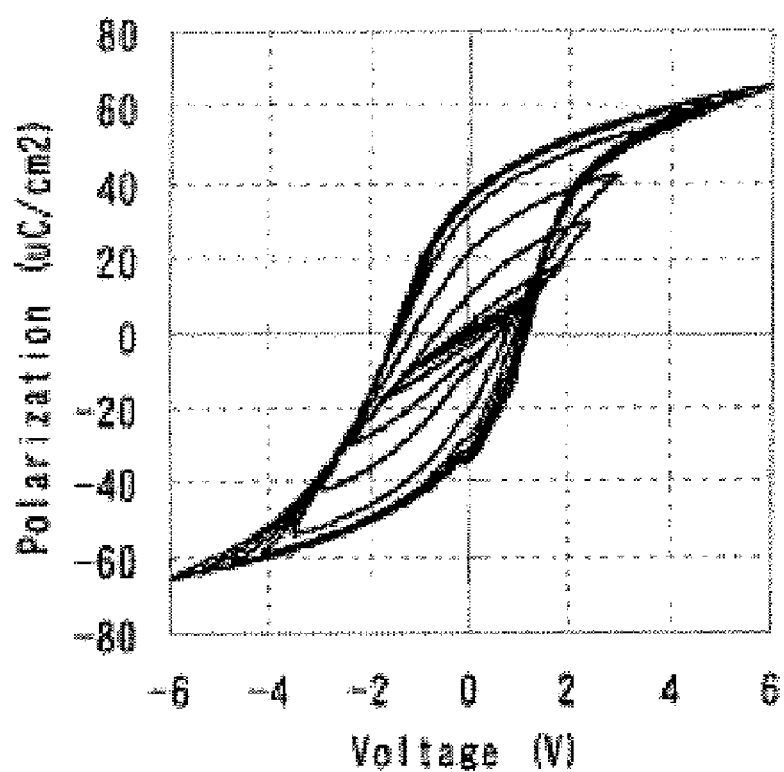
FIG. 14 shows a result of hysteresis characteristic measurement conducted on a capacitor in accordance with a comparison example 2 of an experimental example.
Figure 15:
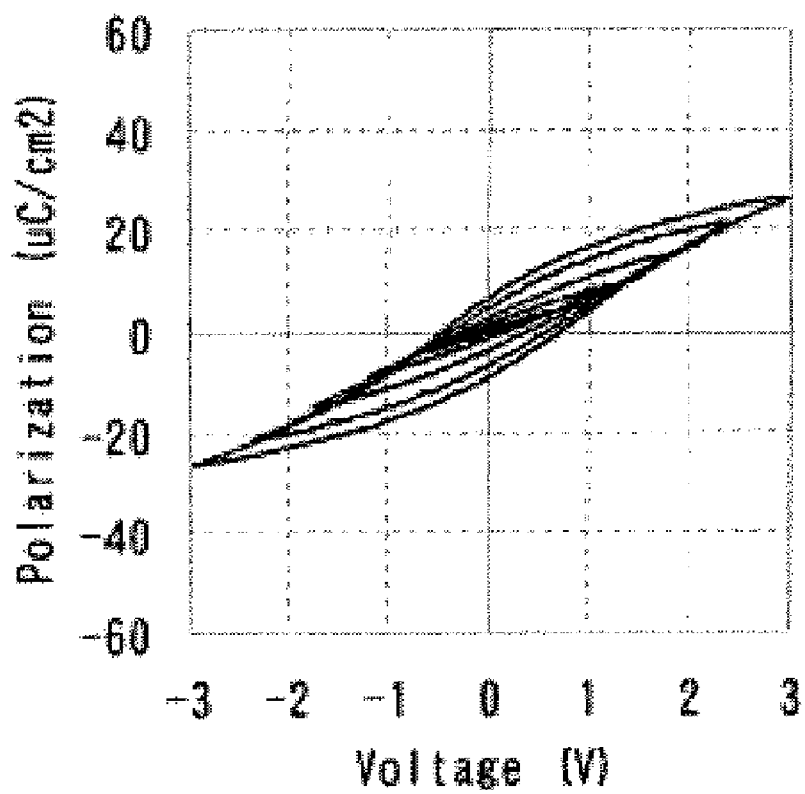
FIG. 15 shows a result of hysteresis characteristic measurement conducted on a dielectric film that is composed of a PZTN single layer.

Furthermore, as shown in Table 2, when the third dielectric film 15 was formed, but the heat treatment step was not conducted before formation of the third dielectric film 15 (Condition c), the peak intensity ratio at (111) of the dielectric film 5 was 89%. In contrast, when the heat according to Conditions a, b and d in Table 1, respectively. FIG. 13 and FIG. 14 show results of hysteresis characteristic measurement conducted on Comparison Examples 1 and 2 shown in Table 1, respectively. FIG. 15 shows a result of hysteresis characteristic measurement when the capacitor was fabricated, using a PZTN layer as the second dielectric film 13 (in other words, when the dielectric film 5 was a PZTN single layer), under the conditions of Comparison Example 1 in Table 1. It is noted that, in FIG. 10, FIG. 11 and FIG. 14, $PbZr_{0.16}Ti_{0.60}Nb_{0.24}O_3$ was used as the first dielectric film 11 and the third dielectric film 15, and $PbZr_{0.3}Ti_{0.7}O_3$ was used as the second dielectric film 13, as described above. Further, in FIG. 12 and FIG. 13, $PbZr_{0.24}Ti_{0.56}Nb_{0.20}O_3$ was used as the first dielectric film 11 and the third dielectric film 15, and $PbZr_{0.4}Ti_{0.6}O_3$ was used as the second dielectric film 13. Also, in the case shown in FIG. 15, $PbZr_{0.24}Ti_{0.56}Nb_{0.20}O_3$ was used as the second dielectric film 13.

When the capacitors 100 were fabricated according to Conditions a, b and d (see FIGS. 10-12), they exhibited hysteresis characteristics with greater remanent polarization, compared to the case where the capacitor was fabricated by using a PZTN single layer as the dielectric film 5 (see FIG. 15). Further, when the capacitor 100 was fabricated according to Condition d (see FIG. 12), the hysteresis curve is symmetrical with respect to the voltage axis and the polarization axis, which indicates excellent hysteresis characteristics. On the other hand, when the capacitors were fabricated according to the conditions of Comparison Examples 1 and 2 (see FIG. 13 and FIG. 14), their hysteresis curve is asymmetrical with respect to the voltage axis and the polarization axis, and their hysteresis characteristics were not favorable.

1.4. The capacitor 100 in accordance with the present embodiment includes the first ferroelectric film 11 that is formed on the lower electrode 4 and composed of PZTN, and the second ferroelectric film 13 that is formed on the first dielectric film 11 and composed of PZT or PZTN with a smaller Nb composition than that of PZTN composing the first dielectric film 11. As a result, the ferroelectric film 5 (the first and second dielectric films 11 and 13) can be oriented in (111) to a higher degree, and its remanent polarization can be made greater. This was confirmed by the experimental examples described above. This phenomenon is believed to have occurred because of the following reasons.

Figure 16:
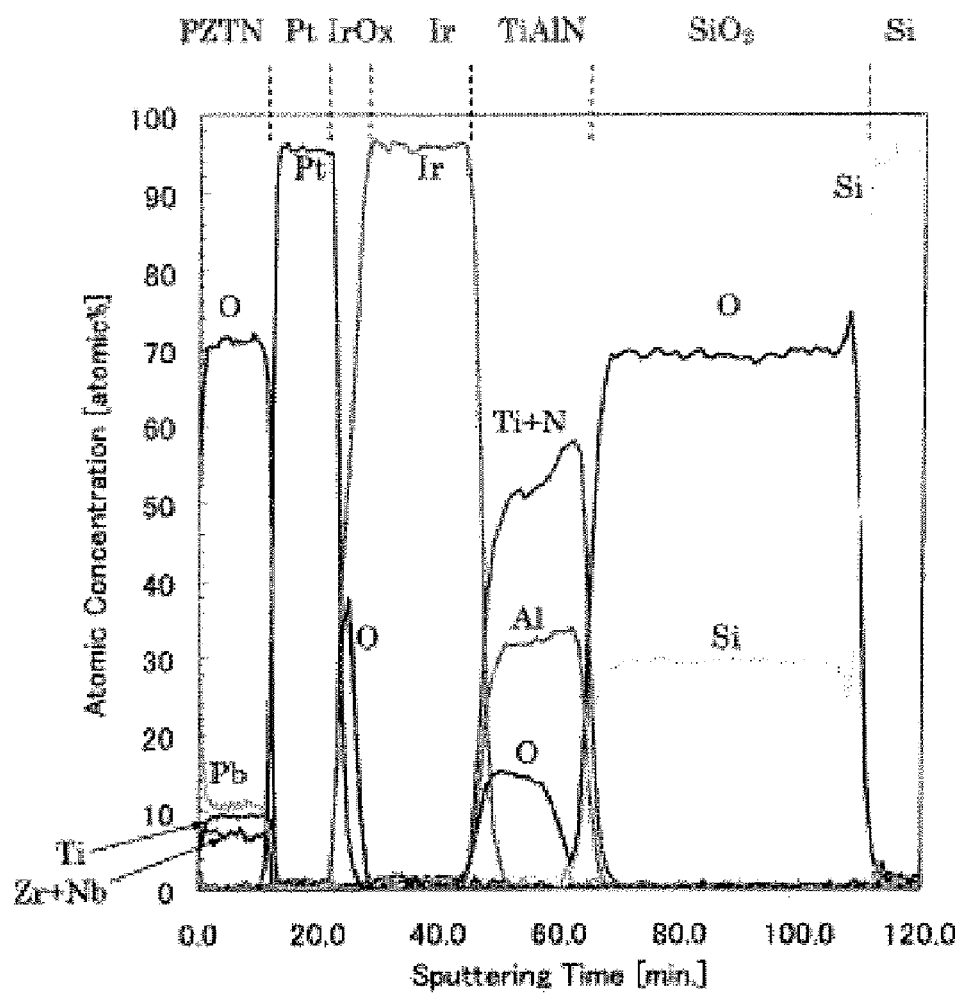
FIG. 16 shows an analysis result of Auger electron spectroscopy (AES) in accordance with a first embodiment.

For example, if the second dielectric film 13 composed of PZT is formed directly on the lower electrode 4 without forming a first dielectric film 11, constituting elements of the lower electrode 4 and the second dielectric film 13 may be mutually diffused. For this reason, heterogeneous phases such as titanium oxide ($TiO_2$), lead oxide (PbO) and the like may be formed at interfaces between the lower electrode 4 and the second dielectric film 13, and it is believed that such heterogeneous phases inhibit orientation of PZT to a higher degree. In contrast, when the first dielectric film 11 composed of PZTN is formed on the lower electrode 4, in accordance with the present embodiment, mutual diffusion of constituting elements of the lower electrode 4 and the second dielectric film 13 can be prevented. FIG. 16 shows analysis results of Auger electron spectroscopy (AES), which proves the phenomenon described above. As shown in FIG. 16, it is observed that hardly any mutual diffusion occurs among platinum (Pt) composing the topmost layer of the lower electrode 4 and lead (Pb), zirconium (Zr), titanium (Ti) and oxygen (O) composing the first dielectric film 11 composed of PZTN. Accordingly, when the first dielectric film 11 composed of PZTN is formed on the lower electrode 4, the aforementioned heterogeneous phases are not formed at interfaces between the lower electrode 4 and the first dielectric film 11. For this reason, the first dielectric film 11 composed of PZTN that is oriented to a high degree can be formed on the lower electrode 4. Furthermore, PZT composing the second dielectric film 13 formed on the first dielectric film 11 or PZTN with a smaller Nb composition than that of PZTN composing the first dielectric film 11 can be oriented to a higher degree.

Further, in PZT or PZTN having a smaller Nb composition, its remanent polarization is more difficult to be influenced by the amount of (111) orientation than PZTN having a greater Nb composition. Therefore, when PZT or PZTN having a smaller Nb composition is used as the second dielectric film 13, its remanent polarization can be made greater, compared to the case where PZTN having a greater Nb composition is used as the second dielectric film 13.

In view of the above, in accordance with the capacitor 100 in accordance with the present embodiment, the dielectric film 5 (the first and second dielectric films 11 and 13) can be oriented in (111) to a greater degree, and its remanent polarization can be made greater. In other words, the capacitor 100 in accordance with the present embodiment can have the dielectric film 5 having excellent crystallinity and excellent hysteresis characteristics.

Moreover, the capacitor 100 in accordance with the present embodiment may further have the third dielectric film 15 composed of PZTN over the second dielectric film 13. By this, the dielectric film 5 (the first through third dielectric films 11, 13 and 15) can be oriented in (111) to a higher degree. Also, the hysteresis curve can be made symmetrical with respect to the voltage axis and the polarization axis, whereby excellent hysteresis characteristics can be obtained. These phenomena are confirmed by the experiment examples described above. Reasons why the hysteresis curve can be made symmetrical with respect to the voltage axis and the polarization axis are believed to be as follows.

As described above, heterogeneous phases such as $TiO_2$, PbO and the like are not formed at interfaces between the first dielectric film 11 composed of PZTN and the lower electrode 4. Similarly, the heterogeneous phases described above are not formed at interfaces between the third dielectric film 15 composed of PZTN and the upper electrode 6. Accordingly, at interfaces between the first dielectric film 11 and the lower electrode 4 and interfaces between the third dielectric film 15 and the upper electrode 6, the composition of the constituent elements is more uniform, compared to the case, for example, where the first dielectric film 11 and the third dielectric film 15 are not formed. By interposing the second dielectric film 13 between the first dielectric film 11 and the third dielectric film 15, the upper and lower structures of the capacitor 100 can be made generally symmetrical through the second dielectric film 13. In other words, the symmetric property of the capacitor 100 can be made better. For the reasons described above, by the capacitor 100 in accordance with the present embodiment, its hysteresis curve can be made symmetrical with respect to the voltage axis and the polarization axis, which leads to an improvement of the reliability of the capacitor 100.

Also, in accordance with the present embodiment, in the stacked type ferroelectric memory device 200, the capacitor 100 is directly formed on the plug layer 451 composed of, for example, tungsten (W). Therefore, it is desirous to prevent oxidation of the plug layer 451 in the process of forming the capacitor 100. For example, by using a laminated film of a nitride layer (for example, TiAlN layer, an Ir layer, an IrOx layer and a Pt layer laminated in this order as the lower electrode 4 (hereafter referred to as a "stacked type electrode"), oxidation of the plug layer 451 can be prevented. It is noted that the nitride layer is an adhesion layer between the first interlayer dielectric film 420 and the lower electrode 4. The Ir layer is an oxygen barrier layer that can prevent oxidation of the nitride layer. The IrOx layer is an adhesion layer between the Pt layer and the Ir layer. The Pt layer is a layer that makes it easier for the dielectric film 5 formed thereon to have (111) orientation, and is oriented in (111). In contrast to the stacked type ferroelectric memory device 200, the planar type ferroelectric memory device 200 does not necessarily require prevention of oxidation of the plug layer 451, and therefore, a laminated film of, for example, a titanium oxide (TiOx) layer and a Pt layer laminated in this order (hereafter referred to as a "planar type electrode") may be used as the lower electrode 4.

Figure 17:
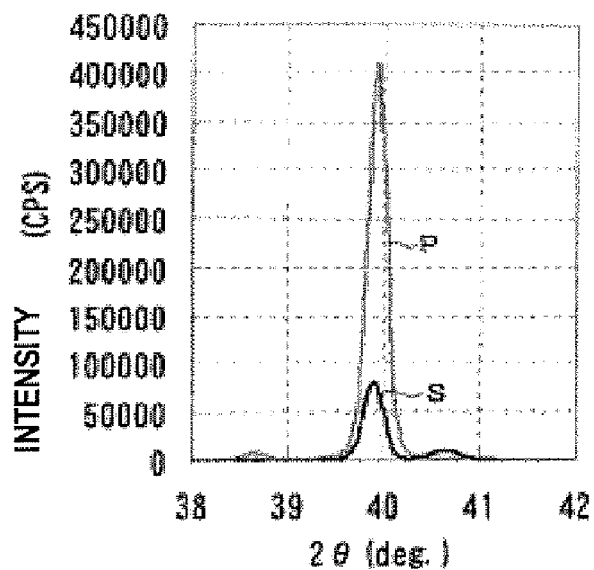
FIG. 17 shows a result of X-ray diffraction measurement conducted on Pt of a stacked type electrode and a planar type electrode.

FIG. 17 shows results of X-ray diffraction measurement conducted on Pt (111) in the stacked type electrode and the planar type electrode. In FIG. 17, a graph S indicates the case of the stacked type electrode, and a graph P indicates the case of the planar type electrode. It is observed, as shown in FIG. 17, that the crystallinity of the Pt layer at the topmost layer of the stacked type electrode is inferior to that of the Pt layer at the topmost layer of the planar type electrode. Even when a stacked type electrode is used as the lower electrode 4, the capacitor 100 in accordance with the present embodiment can have the ferroelectric film 5 with excellent crystallinity, and can have excellent hysteresis characteristics. This is confirmed by the experimental examples described above. Accordingly, the capacitor 100 in accordance with the present embodiment is very effective when it is used in the stacked type ferroelectric memory device 200, which is capable of further miniaturization than the planar type ferroelectric memory device 200.

Also, by the capacitor 100 in accordance with the present embodiment, diffusion of oxygen elements between the stacked type electrode (the lower electrode 4) and PZTN (the first dielectric film 11) hardly occurs, as shown in FIG. 16. For this reason, the capacitor 100 in accordance with the present embodiment is effective when it is used in the stacked type ferroelectric memory device 200.

2. Second Embodiment 2.1. Next, an actuator and a liquid jetting head in accordance with a second embodiment of the invention are described.

Figure 18:
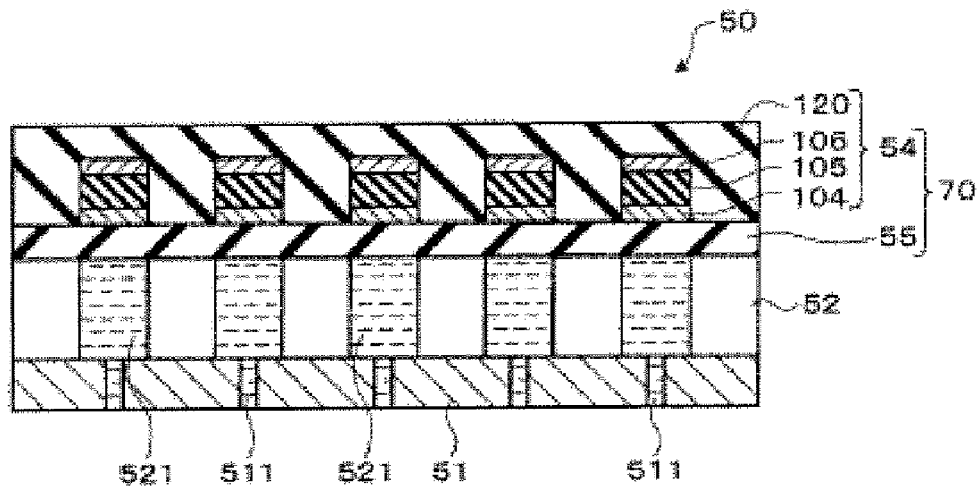
FIG. 18 shows a cross-sectional view schematically showing a liquid jetting head in accordance with a second embodiment of the invention.
Figure 19:
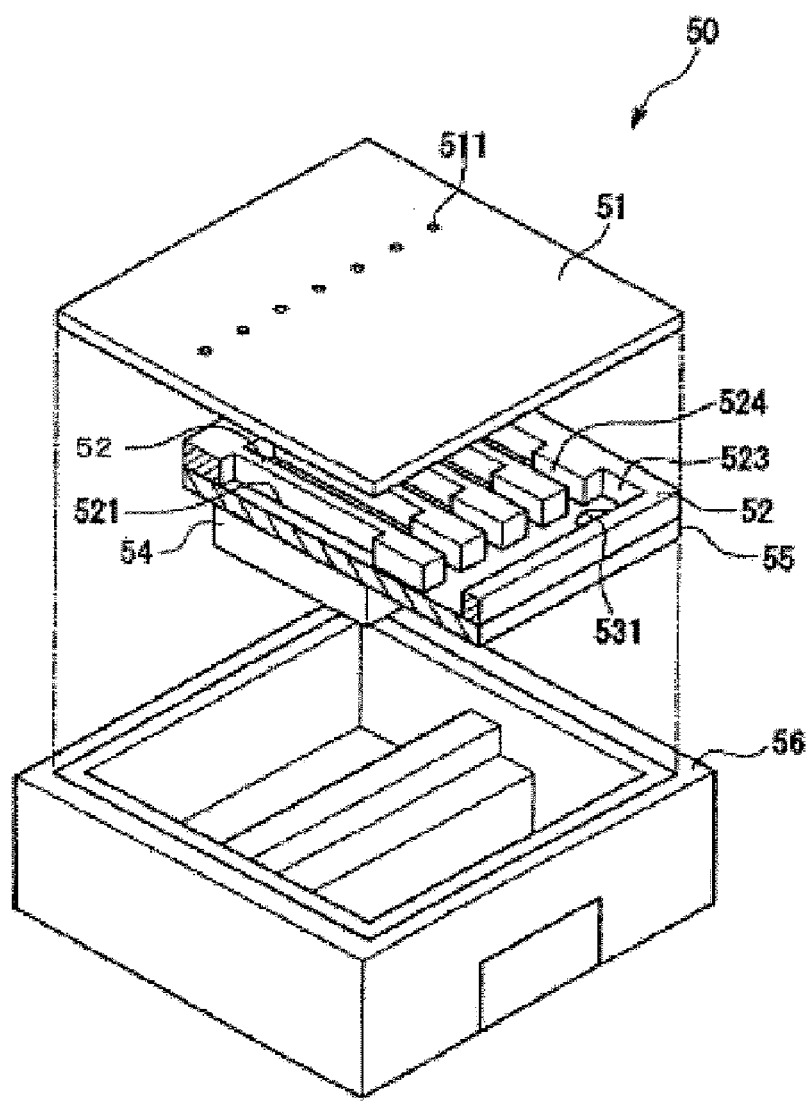
FIG. 19 shows an exploded perspective view of the liquid jetting head in accordance with the second embodiment of the invention.

FIG. 18 is a cross-sectional view schematically showing a liquid jetting head 50 in accordance with the present embodiment. FIG. 19 is an exploded perspective view of the liquid jetting head 50 in accordance with the present embodiment. It is noted that FIG. 9 shows a state of the liquid jetting head 50, which is upside down with respect to its normal state in use.

The liquid jetting head 50 includes a nozzle plate 51, a substrate 52, and an actuator 70, as shown in FIG. 18. The actuator 70 includes a flexible plate 55 formed on the substrate 52, and a piezoelectric section (a source of vibration) 54 formed on the flexible plate 55. The piezoelectric section 54 includes a lower electrode 104, a dielectric film 105 and an upper electrode 106. The piezoelectric section 54 may further include a dielectric layer 120 that covers the lower electrode 104, the dielectric film 105 and the upper electrode 106. In the actuator 70 and the liquid jetting head 50, the lower electrode 4, the dielectric film 5 and the upper electrode 6 described above in accordance with the first embodiment can be applied as the lower electrode 104, the dielectric film 105 and the upper electrode 106, respectively. It is noted that illustration of each of the layers in the piezoelectric section 54 is omitted in FIG. 19.

The liquid jetting head 50 further includes a base substrate 56, as shown in FIG. 19. A nozzle plate 51, a substrate 52, an elastic plate 55, and piezoelectric sections 504 are housed in the base substrate 56. The base substrate 56 is formed with a material selected from, for example, various kinds of resin materials and metal materials.

The nozzle plate 51 is formed from, for example, a rolled plate of stainless steel or the like. The nozzle plate 51 includes multiple nozzle holes 511 formed in a row for jetting liquid droplets. The substrate 52 is affixed to the nozzle plate 51. The substrate 52 partitions spaces between the nozzle plate 51 and the flexible plate 55, thereby forming a reservoir 523, supply ports 524, and a plurality of flow channels 521. The reservoir 523 temporarily reserves liquid that is supplied from an ink cartridge (not shown). The liquid is supplied from the reservoir 523 to the respective flow channels 521 through the supply ports 524.

The flow channels 521 are disposed in a manner to correspond with the respective nozzle holes 511, as shown in FIG. 18 and FIG. 19. The nozzle holes 511 are continuous with the flow channels 521. Volumes of the respective flow channels 521 are variable by vibration of the elastic plate 55. Liquid is ejected from the flow channels 521 by the volume change.

A through hole 531 that penetrates the elastic plate 55 in its thickness direction at a predetermined position of the elastic plate 55, as shown in FIG. 19. Liquid is supplied from the liquid cartridge to the reservoir 523 through the through hole 531.

The piezoelectric sections 54 are electrically connected to a piezoelectric element driver circuit (not shown), and can operate (vibrate, deform) based on signals provided by the piezoelectric element driver circuit. The elastic plate 55 can vibrate (flex) by vibration (flex) of the piezoelectric section 54, thereby instantaneously increasing the inner pressure of the flow channel 521.

2.2. In accordance with the present embodiment, the dielectric film 105 with excellent crystallinity can be provided, like the first embodiment. As a result, the quality of the actuator 70 and the liquid jetting head 50 can be improved.

3. The embodiments of the invention are described above in detail. However, those skilled in the art should readily understand that many modifications can be made without departing in substance from the novel matter and effects of the invention. Accordingly, those modified examples are also included in the scope of the invention.

What is claimed is:

1. A capacitor comprising:
   a lower electrode;
   a first dielectric film composed of lead zirconate titanate niobate formed above the lower electrode;
   a second dielectric film composed of one of lead zirconate titanate and lead zirconate titanate niobate with a Nb composition smaller than a Nb composition of the lead zirconate titanate niobate composing the first dielectric film; and
   an upper electrode formed above the second dielectric film.

2. A capacitor according to claim 1, comprising a third dielectric film composed of lead zirconate titanate niobate and formed above the second dielectric film, wherein, when the second dielectric film is composed of lead zirconate titanate niobate, the lead zirconate titanate niobate composing the third dielectric film has a Nb composition that is greater than a Nb composition of the lead zirconate titanate niobate composing the second dielectric film.

3. A method for manufacturing a capacitor, comprising the steps of:
   forming a lower electrode above a substrate;
   forming a first dielectric film composed of lead zirconate titanate niobate above the lower electrode;
   forming, above the first dielectric film, a second dielectric film composed of one of lead zirconate titanate and lead zirconate titanate niobate with a Nb composition smaller than a Nb composition of the lead zirconate titanate niobate composing the first dielectric film;

applying a heat treatment to at least the second dielectric film;

forming a third dielectric film composed of lead zirconate titanate niobate above the second dielectric film; and forming an upper electrode above the third dielectric film, wherein, when the second dielectric film is composed of lead zirconate titanate niobate, the lead zirconate titanate niobate composing the third dielectric film has a Nb composition that is greater than a Nb composition of the lead zirconate titanate niobate composing the second dielectric film, and the heat treatment is conducted before the step of forming the third dielectric film.

4. A ferroelectric memory device comprising:

a lower electrode;

a first dielectric film composed of lead zirconate titanate niobate and formed above the lower electrode;

a second dielectric film composed of one of lead zirconate titanate and lead zirconate titanate niobate with a Nb composition smaller than a Nb composition of the lead zirconate titanate niobate composing the first dielectric film;

an upper electrode formed above the second dielectric film; and a control circuit section that is electrically connected to at least one of the lower electrode and the upper electrode.

5. A ferroelectric memory device according to claim 4, comprising a substrate, an interlayer dielectric film formed above the substrate, and a plug layer embedded in a contact hole formed in the interlayer dielectric film, wherein the lower electrode is formed in contact with at least an upper surface of the plug layer.

* * * * *